United States Patent
Fitzsimmons et al.

(10) Patent No.: US 6,626,188 B2
(45) Date of Patent: Sep. 30, 2003

(54) METHOD FOR CLEANING AND PRECONDITIONING A CHEMICAL VAPOR DEPOSITION CHAMBER DOME

(75) Inventors: John A. Fitzsimmons, Poughkeepsie, NY (US); Thomas H. Ivers, Hopewell Junction, NY (US); Pavel Smetana, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 146 days.

(21) Appl. No.: 09/894,499

(22) Filed: Jun. 28, 2001

(65) Prior Publication Data

US 2003/0000545 A1 Jan. 2, 2003

(51) Int. Cl.[7] .................................................. C25F 5/00
(52) U.S. Cl. .............................. 134/1.1; 134/2; 134/21; 134/22.1; 134/22.18; 134/26; 134/30; 216/63; 216/64; 156/345.24; 156/345.33; 156/345.34; 156/345.37; 156/345.48; 438/905
(58) Field of Search .............................. 134/1.1, 2, 21, 134/22.1, 22.18, 26, 30; 216/63, 64; 438/905; 156/345.29, 345.33, 345.34, 345.37, 345.48

(56) References Cited

U.S. PATENT DOCUMENTS

| | | | |
|---|---|---|---|
| 5,129,958 A | * | 7/1992 | Nagashima et al. ....... 134/22.1 |
| 5,326,723 A | * | 7/1994 | Petro et al. ................. 438/685 |
| 5,405,480 A | | 4/1995 | Benzing et al. ............. 156/345 |
| 5,812,403 A | | 9/1998 | Fong et al. ............. 364/468.28 |
| 6,121,161 A | | 9/2000 | Rossman et al. ........... 438/783 |
| 6,129,808 A | | 10/2000 | Wicker et al. .............. 156/345 |
| 6,136,211 A | | 10/2000 | Qian et al. ..................... 216/37 |
| 6,200,412 B1 | | 3/2001 | Kilgore et al. .............. 156/345 |
| 6,432,259 B1 | * | 8/2002 | Noorbakhsh et al. .. 156/345.33 |
| 6,467,490 B1 | * | 10/2002 | Kawata et al. ............... 134/1.1 |

* cited by examiner

Primary Examiner—Randy Gulakowski
Assistant Examiner—M. Kornakov
(74) Attorney, Agent, or Firm—Margaret A. Pepper

(57) ABSTRACT

The present invention relates generally to the field of semiconductor device manufacturing, and more specifically to a method for cleaning and preconditioning a dome in a chemical vapor deposition system. During cleaning, the direction of flow of cooling water through an induction coil in the dome is reversed. During preconditioning, the direction of cooling water flow is preferably reversed again, such that it is the same direction as during deposition. The preconditioning portion of the method comprises introducing a hydrogen gas into the CVD chamber, and then introducing a mixture of hydrogen gas and nitrogen gas into the chamber.

24 Claims, 3 Drawing Sheets

TO VACUUM PUMP

METHOD FOR CLEANING AND PRECONDITIONING A CHEMICAL VAPOR DEPOSITION CHAMBER DOME

FIELD OF THE INVENTION

The present invention relates generally to the field of chemical vapor deposition (CVD) in semiconductor device manufacturing, and more specifically to a method for cleaning and preconditioning a dome in a CVD system.

BACKGROUND OF THE INVENTION

Chemical vapor deposition (CVD) processes are used widely in the manufacture of semiconductor devices. Generally, CVD involves exposing a semiconductor wafer to a reactive gas under carefully controlled conditions including elevated temperatures, sub-ambient pressures and uniform reactant gas flow rate, resulting in the deposition of a thin, uniform layer or film on the surface of the substrate. The undesired gaseous byproducts of the reaction are then pumped out of the deposition chamber. The CVD reaction may be driven thermally or by a reactant plasma, or by a combination of heat and plasma. CVD systems in which the reaction is driven by a reactant plasma are known as plasma-assisted or plasma-enhanced.

A typical plasma-enhanced CVD system is a single-wafer system utilizing a high-throughput CVD chamber. The chamber typically comprises an aluminum oxide ($Al_2O_3$) dome, an induction coil that is provided in an expanding spiral pattern adjacent to the dome and outside the chamber, at least one gas injection nozzle, and a vacuum pump for evacuating the gaseous byproducts of the CVD process from the chamber. RF power is applied to the induction coil to generate a reactive plasma within the chamber. A cooling fluid, such as cooling water, is also typically flowed through the induction coil, either from the bottom of the dome to the top of the dome, or from the top of the dome to the bottom of the dome.

A typical CVD process begins with heating of the CVD chamber. A semiconductor substrate is placed in the chamber on a receptor, also known as a susceptor, which is typically made of ceramic or anodized aluminum. Next, reactant gases are introduced into the chamber, while regulating the chamber pressure. The gases react in the chamber to form a deposition layer on the surface of the wafer.

In a typical deposition process, reactant gases enter the reaction chamber and produce films of various materials on the surface of a substrate for various purposes, such as for dielectric layers, insulation layers, etc. The various materials deposited include epitaxial silicon, polysilicon, silicon nitride, silicon oxide, and refractory metals such as titanium, tungsten and their suicides. Much of the material produced from the reactant gases is deposited on the wafer surface. However, some material also is inevitably deposited on other surfaces inside the chamber. These deposits must be removed periodically to prevent them from building up to the point where particulate contamination is generated, which can cause opens or shorts in the microelectronic device.

The material which is deposited on the interior chamber walls is usually deposited with a nonuniform thickness. This nonuniformity in thickness results in part from a temperature gradient in the dome produced by cooling water flowing through the induction coil. For example, if cooling water enters the induction coil at the bottom of the dome and exits at the top of the dome, then the dome will be slightly cooler at the bottom than at the top, because the cooling water is gradually heated as it flows through the coil. This temperature gradient within the dome will result in a deposition thickness which is greater at the bottom than at the top.

In a typical CVD system, after one or more deposition processes wherein a film is deposited onto a semiconductor substrate and the substrate is removed from the chamber, a cleaning gas or mixture of cleaning gases is purged through the reaction chamber in order to clean unwanted deposits from the chamber interior surfaces, including the chamber walls and the susceptor. For cleaning silicon dioxide ($SiO_2$) films from the chamber interior, a typical cleaning gas system comprises fluorinecontaining gases, such as a mixture of nitrogen trifluoride ($NF_3$) and hexafluoroethane ($C_2F_6$). A plasma gas is typically ignited in the chamber to enhance the efficiency of the cleaning gas mixture. The plasma creates fluorine radicals which react with the $SiO_2$ film under the influence of ion bombardment to form $SiF_4$ and other volatile compounds, which are then pumped out of the reaction chamber by the vacuum pump.

However, some of the fluorine-containing species in the cleaning gas also react with the $Al_2O_3$ in the dome to form $AlF_3$, especially in areas of the dome where $SiO_2$ coverage is thinner. For example, if the direction of cooling water flow is from the bottom of the dome to the top, then $SiO_2$ coverage will be thinner at the top. Therefore, with uniform cleaning rates throughout the chamber, the $SiO_2$ at the top of the dome will be removed before it is completely removed at the bottom of the dome. To achieve complete removal of deposited $SiO_2$ at the bottom of the dome, the top of the dome will be "over-cleaned," resulting in conversion of $Al_2O_3$ at the top of the dome to $AlF_3$.

This problem of over-cleaning is exacerbated by the temperature gradient in the dome discussed previously. If the direction of cooling water flow is from the bottom of the dome to the top, then the dome is slightly cooler at the bottom, resulting in poorer cleaning efficiency at the bottom. To achieve complete removal of deposited $SiO_2$ at the bottom of the dome, over-cleaning to an even greater extent will result at the top of the dome.

Therefore, after each cleaning step, it is necessary to precondition or passivate the dome, in order to convert the $AlF_3$ species on the dome back to $Al_2O_3$. A typical preconditioning process comprises introducing $H_2$, and then a mixture of $H_2$ and $O_2$ into the chamber. It is believed that the initial amount of $H_2$ reacts with $AlF_3$ species on the dome to partially passivate the dome, producing some $Al_2O_3$ and intermediate $Al_yO_x$ and $Al_yO_xF_z$ species. (In the variable stoichiometric formulas presented throughout this document, such as $Al_yO_x$ and $Al_yO_xF_z$, the variables x, y and z represent, independently, integer or fractional numbers, and may be the same or different.) The subsequent mixture of activated $H_2$ and $O_2$ reacts with these intermediate species to form $Al_2O_3$. Byproducts of this reaction include hydrofluoric acid (HF) and water. The production of water as a byproduct severely limits the passivation reaction, because water is a contaminant which is very difficult to remove once absorbed on the dome surface. In addition, HF combines with water to form aqueous HF, which is also a very difficult species to remove once absorbed. Therefore, the presence of water and aqueous HF prevent overpassivation and often result in incomplete passivation of the dome, leaving some of the $AlF_3$ species on the dome.

The presence of some $AlF_3$ species on the dome during subsequent processing in the CVD chamber can cause significant particulate contamination. During deposition, the AlF$_3$ species may react with process gases to form gaseous byproducts, which will release particulate contamination. Specifically, it is believed that AlF$_3$ reacts with process gases such as N$_2$, SiH$_4$ and H$_2$ to form gaseous byproducts such as HF, SiF$_4$ and NF$_3$. The conversion of AlF$_3$ to these gaseous byproducts causes the release of films which have been deposited on top of the AlF$_3$ species. The release of these films creates particulate contamination, which can severely impact microelectronic device yield and reliability.

The problem of incomplete passivation is of particular concern when depositing silicon nitride (SiN) films. Because SiN forms a different bond with Al$_2$O$_3$ and AlF$_3$ than does SiO$_2$, particle formation as a result of weaker adhesion of subsequently deposited films during deposition is more likely. For example, particulate contamination may be generated as a result of stress-induced de-adhesion of pre-coat during the deposition of product.

SUMMARY OF THE INVENTION

The present invention eliminates the aforementioned problems by providing a method for cleaning and preconditioning the dome of a CVD chamber.

In a first aspect of the present invention, a method is provided for preconditioning a dome of a chemical vapor deposition chamber, comprising the steps of: introducing hydrogen gas into said chamber; generating a reactive plasma of said hydrogen gas in said chamber; introducing a mixture of hydrogen gas and nitrogen gas into said chamber; and generating a reactive plasma of said mixture of hydrogen gas and nitrogen gas in said chamber.

In another aspect of the present invention, a method is provided for cleaning a dome of a chemical vapor deposition chamber, wherein said dome is cooled during deposition by flowing a cooling fluid in a first direction through an induction coil having multiple windings provided in an expanding spiral pattern in said dome. The method comprises the steps of: flowing said cooling fluid in a second direction through said induction coil, such that said second direction is opposite said first direction; introducing at least one cleaning gas into said chamber; and generating a reactive plasma of said cleaning gas.

In yet another aspect of the present invention, a method is provided for cleaning and preconditioning a dome of a chemical vapor deposition chamber, wherein said dome is cooled during deposition by flowing a cooling fluid in a first direction through an induction coil having multiple windings provided in an expanding spiral pattern in said dome. The method comprises the steps of: flowing said cooling fluid in a second direction through said induction coil, such that said second direction is opposite said first direction; introducing at least one cleaning gas into said chamber; generating a reactive plasma of said cleaning gas; evacuating said cleaning gas from said chamber; flowing said cooling fluid in said first direction through said induction coil; introducing hydrogen gas into said chamber; generating a reactive plasma of said hydrogen gas in said chamber; introducing a mixture of hydrogen gas and nitrogen gas into said chamber; and generating a reactive plasma of said mixture of hydrogen gas and nitrogen gas in said chamber.

A preferred apparatus for cooling a dome of a chemical vapor deposition chamber is also provided, wherein said dome has a top and a bottom, and said dome comprises an induction coil which is comprised of copper tubing and has multiple windings provided in an expanding spiral pattern in said dome. The apparatus comprises a first connection point at a first end of said copper tubing, for connecting a cooling fluid supply to said copper tubing; a second connection at a second end of said copper tubing, for connecting a cooling fluid return to said copper tubing; first and second valves provided between and in fluid communication with said first connection point and said dome, wherein said first valve is in fluid communication with the top of said dome and said second valve is in fluid communication with the bottom of said dome; third and fourth valves provided between and in fluid communication with said second connection point and said dome, wherein said third valve is in fluid communication with the top of said dome, and said fourth valve is in fluid communication with the bottom of said dome.

BRIEF DESCRIPTION OF THE DRAWINGS

The features of the invention believed to be novel and the elements characteristic of the invention are set forth with particularity in the appended claims. The drawings are for illustration purposes only and are not drawn to scale. Furthermore, like numbers represent like features in the drawings. The invention itself, however, both as to organization and method of operation, may best be understood by reference to the detailed description which follows, taken in conjunction with the accompanying drawings, in which:

DETAILED DESCRIPTION OF THE INVENTION

The problems of over-cleaning and incomplete passivation can be eliminated by using the cleaning and preconditioning method of the present invention.

Figure 1:
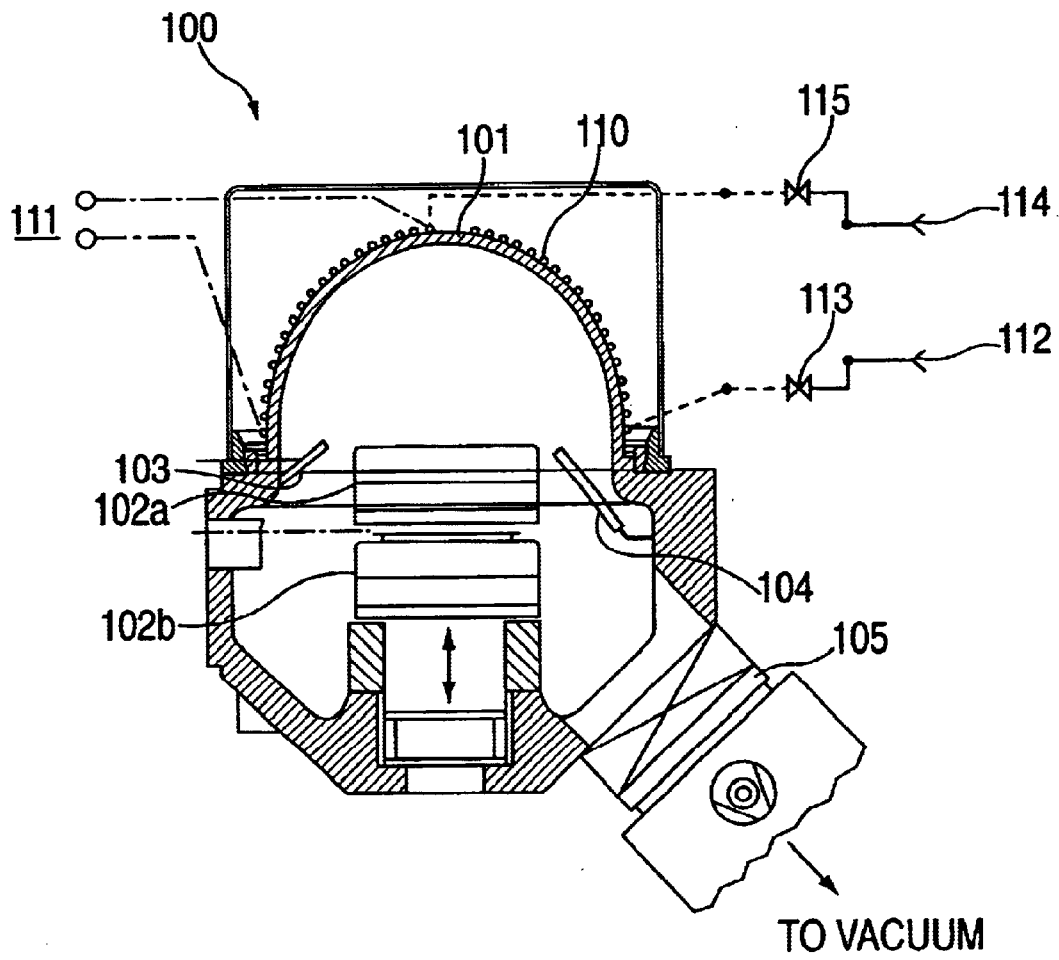
FIG. 1 is a schematic view of a typical CVD system.
Figure 2:
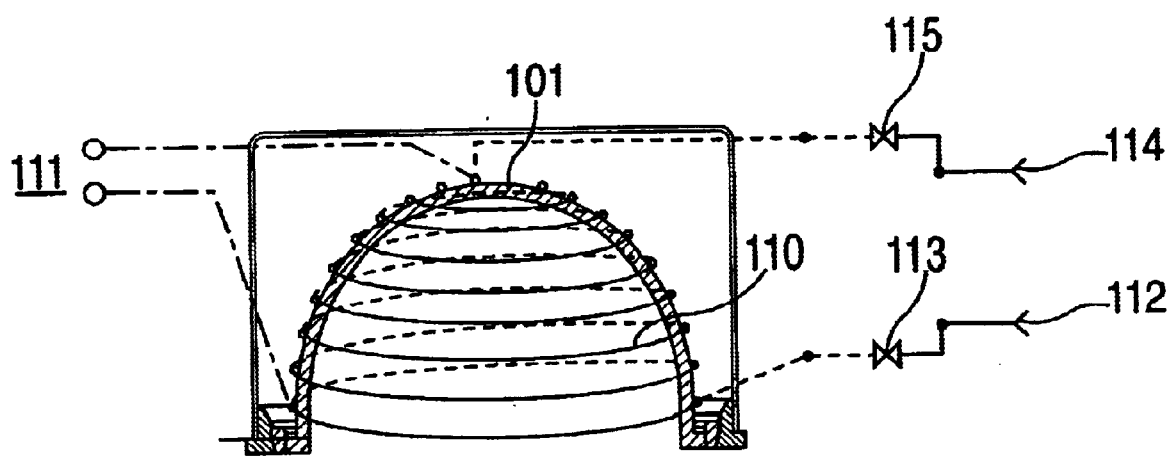
FIG. 2 is a more detailed view of a portion of a typical CVD system.

FIG. 1 shows a typical CVD system 100 comprising a dome 101, wafer susceptor 102, process gas injector 103, cleaning gas injector 104, and exhaust manifold 105. Dome 101 is typically made of an insulating dielectric, such as Al$_2$O$_3$. Dome 101 includes an induction coil 110, which is provided in an expanding spiral pattern. FIG. 2 shows a detail of the expanding spiral pattern of induction coil 110. RF power 111 is applied to induction coil 110 to generate a reactive plasma inside the chamber. Induction coil 110 is typically made of copper tubing, within which a cooling fluid, such as cooling water, is flowed. Cooling water may enter the copper tubing at connection 112 at the bottom of the dome, passing through valve 113, and then exit the copper tubing at connection 114 at the top of dome, passing through valve 115. Alternatively, cooling water may flow through the copper tubing from connection 114 at the top of the dome to connection 112 at the bottom of the dome.

A typical CVD process begins with heating of the CVD chamber. A semiconductor substrate is placed on susceptor 102, which is shown in FIG. 1 in an upper position 102a and a lower position 102b. A semiconductor wafer is placed on susceptor 102 while in lower position 102b, and then susceptor 102 is raised into the chamber to upper position 102a. Next, reactant gases are introduced into the chamber through process gas injector 103. Often, as many as eight process gas injectors may be present in the chamber, although only one injector 103 is shown for simplicity. The process gases react in the chamber to form a deposition layer, such as SiO$_2$ or SiN, on the surface of the wafer. The deposition process may be assisted or enhanced by the generation of a reactive plasma inside the chamber. A plasma maybe generated by applying RF power 111 to induction coil 110.

In addition to forming a deposition layer on the surface of the wafer, the CVD process also forms a film on the interior surfaces of dome 101. During deposition, if cooling water is flowed through induction coil 110 from connection 112 at the bottom of the dome to connection 114 at the top of the dome, then the deposited film on dome 101 will be thicker at the bottom of the dome than at the top of the dome.

Following deposition of a film, such as $SiO_2$ or SiN, the CVD chamber is generally cleaned using a conventional cleaning process wherein at least one fluorine-containing cleaning gas is introduced into the chamber through cleaning gas injector 104. More than one cleaning gas injector may be present in the chamber, although only one injector 104 is shown for simplicity. As discussed previously, in areas of the dome where the film deposition is thinner, some of the $Al_2O_3$ dome is often converted to $AlF_3$ during a conventional cleaning. This nonuniformity in film thickness results from a temperature gradient in the dome during deposition caused by the flow of cooling water through the induction coil. To achieve complete cleaning of areas on the dome having thickest deposition coverage, areas with thinner coverage will be over-cleaned, resulting in conversion of $Al_2O_3$ to $AlF_3$. The same temperature gradient during cleaning results in nonuniform cleaning efficiency, thus exacerbating the problem of over-cleaning.

For example, if cooling water flows through induction coil 110 from connection 112 at the bottom of the dome to connection 114 at the top of the dome, then a temperature gradient will be created wherein the bottom of the dome is slightly cooler than the top of the dome. As a result, the deposition layer will be thickest at the bottom of the dome, but the cleaning efficiency also will be poorer at the bottom of the dome. To achieve complete cleaning of the thickest films at the bottom of the dome, the top of the dome will be over-cleaned, resulting in conversion of some $Al_2O_3$ to $AlF_3$ at the top of the dome.

This problem of over-cleaning can be addressed by the cleaning method of the present invention, which comprises reversing the direction of flow of the cooling water. For example, if during deposition the cooling water flows through induction coil 110 from the bottom of the dome to the top of the dome, then during the cleaning method of the present invention the cooling water flows in the opposite direction, from the top of the dome to the bottom of the dome.

Figure 3:
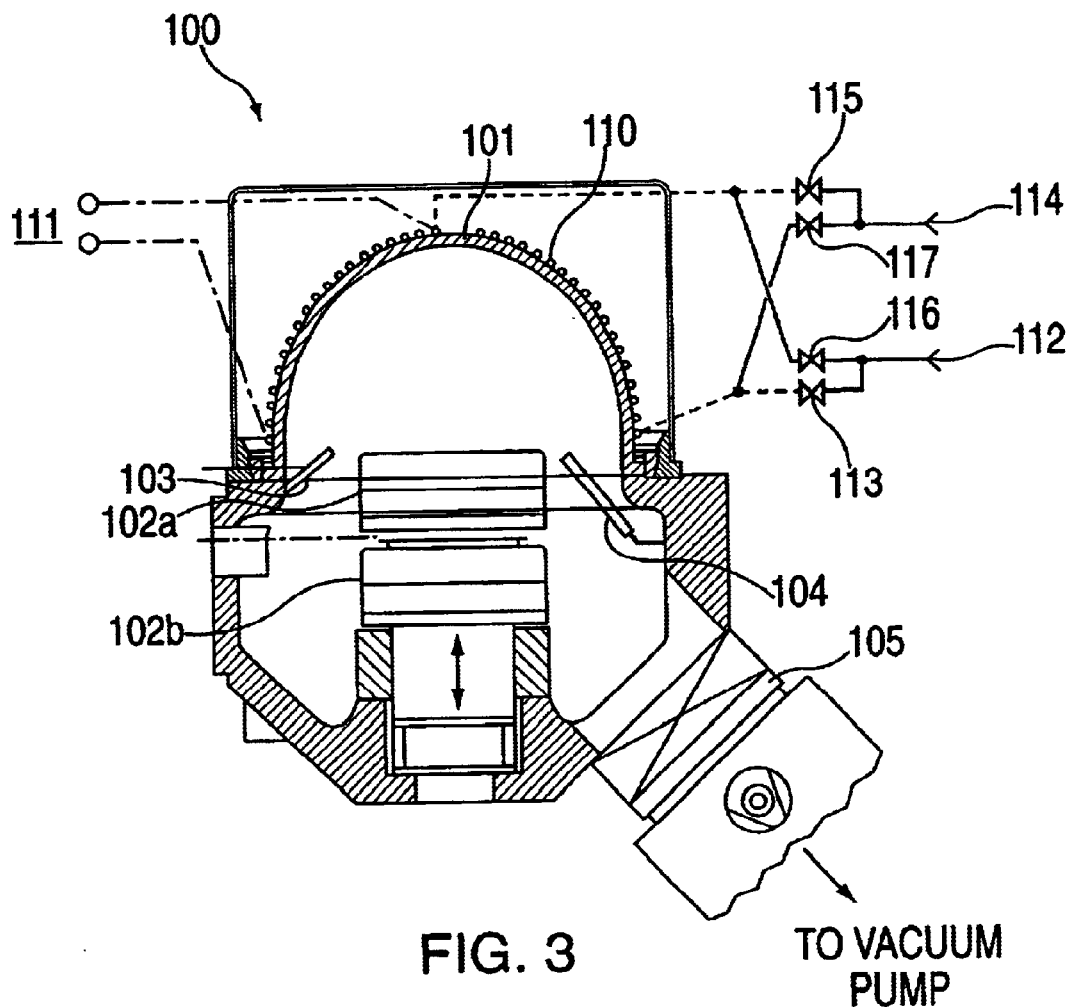
FIG. 3 is a schematic view of a CVD system which includes a cleaning apparatus of the present invention.

Reversing the direction of flow of the cooling water can be accomplished, for example, by simply disconnecting the water supply from connection 112 and reconnecting it to connection 114. Alternatively, reversing the direction of cooling water flow can be accomplished by using the apparatus shown in FIG. 3. In FIG. 3, two cooling water connections 112 and 114 are provided which are in fluid communication with induction coil 110. Two valves 113 and 116 are provided between and in fluid communication with connection 112 and induction coil 110. Valve 113 is in fluid communication with the bottom of the dome, and valve 116 is in fluid communication with the top of the dome. Similarly, two valves 115 and 117 are provided between and in fluid communication with connection 114 and induction coil 110. Valve 115 is in fluid communication with the top of the dome, and valve 117 is in fluid communication with the bottom of the dome. If it is desired to flow cooling water from the bottom of the dome to the top of the dome during deposition, this can accomplished by either of two arrangements. First, cooling water may be supplied through connection 112, with valves 113 and 115 in the open position, and valves 116 and 117 in the closed position. During cleaning, valves 113 and 115 are closed, and valves 116 and 117 are opened, thereby flowing cooling water from the top of the dome to the bottom of the dome. In the second arrangement, cooling water may be supplied through connection 114, with valves 117 and 116 in the open position, and valves 115 and 113 in the closed positions. During cleaning, valves 117 and 116 are closed, and valves 115 and 113 are opened. Using either of these arrangements, the cooling water supply need not be disconnected and reconnected between deposition and cleaning steps.

When the flow of cooling water is reversed, the temperature gradient in the dome is also reversed, so that the bottom of the dome is slightly warmer than the top during cleaning. As a result, the cleaning efficiency is slightly greater at the bottom of the dome where the deposition film is thickest. The thicker film at the bottom of the dome will be removed at a faster rater than the thinner film at the top of the dome, resulting in reduced over-cleaning of areas with thinner deposits, and reduced conversion of $Al_2O_3$ to $AlF_3$.

Nevertheless, even with the flow of cooling water reversed during cleaning, to ensure complete cleaning it is inevitable that some $Al_2O_3$ will be converted to $AlF_3$. Preconditioning of the dome to convert the $AlF_3$ species back to $Al_2O_3$ prior to further CVD processing is therefore necessary. As discussed previously, conventional preconditioning processes produce undesirable contaminants such as water and aqueous HF, therefore precluding overpassivation and often resulting in incomplete passivation. "Overpassivation" in this context can be defined as passivation past the stoichiometric equivalence point in localized areas within the dome, but not necessarily past the overall average endpoint throughout the dome.

In the preconditioning method of the present invention, no undesirable contaminants are produced. Therefore, the passivation reaction need not be limited, and overpassivation is possible. After evacuating the cleaning gases from the chamber, the preconditioning method of the present invention begins with an initial $H_2$ passivation step comprising introduction of $H_2$ through cleaning gas injector 104, and generation of a reactive plasma of the $H_2$ by applying RF power 111 to induction coil 110. It is believed that this initial $H_2$ passivation step produces some $Al_2O_3$ as well as intermediate $Al_yO_x$ and $Al_yO_xF_z$ species. Then, a mixture of $H_2$ and $N_2$ is introduced into the chamber through cleaning gas injector 104, and a plasma of this mixture is generated by applying RF power 111. It is believed that the intermediate $Al_yO_x$ and $Al_yO_xF_z$ species react with $N_2$ to form $Al_yO_xN_z$ and AlN. All other byproducts of the reaction, such as $NH_3$, $NH_4F$, $NF_3$, and various excited $NF_x$ and $AlF_y$ species, are gaseous and are therefore removed from the chamber through exhaust manifold 105 by the vacuum pump. No undesirable water or other aqueous byproducts are formed. Thus, the passivation reaction need not be limited to prevent production of undesirable byproducts, and the dome can be completely passivated.

An added advantage of this preconditioning method can be realized during subsequent deposition of SiN films. It is believed that following preconditioning by the method of the present invention, the dome is comprised of an outer $Al_2O_3$ layer, an intermediate $Al_yO_xN_z$ layer, and an inner AlN layer exposed to the chamber. When a SiN film is subsequently deposited on the exposed AlN layer of the dome, it is believed that an intermediate $Si_yAl_xN_z$ species is formed between the AlN and SiN, thereby providing a stronger bond between the AlN and SiN. This stronger interface reduces the likelihood that portions of the SiN film will be released, causing particulate contamination.

The initial H$_2$ passivation step of the preconditioning method should be performed for a time, at a flowrate, and using an RF power sufficient to partially passivate the AlF$_3$ species on the dome and form intermediate Al$_y$O$_x$ and Al$_y$O$_x$F$_z$ species. Specifically, the H$_2$ gas may be flowed into the chamber for a time ranging from about 20 seconds to about 240 seconds, at a flowrate ranging from about 200 standard cubic centimeters per minute (sccm) to about 1000 sccm. Preferably, the H$_2$ gas is flowed into the chamber at a flowrate of about 600 sccm for about 120 seconds. In addition, sufficient RF power should be applied to generate a plasma of the H$_2$ gas. Specifically, an RF power ranging from about 1000 watts to about 3600 watts, preferably about 2400 watts, may be applied.

The H$_2$/N$_2$ passivation step should be performed for a time, at a flowrate, and using an RF power sufficient to completely convert the intermediate Al$_y$O$_x$ and Al$_y$O$_x$F$_z$ species to Al$_y$O$_x$N$_z$ and AlN. Specifically, the H$_2$ gas may be flowed into the chamber for a time ranging from about 20 seconds to about 240 seconds, at a flowrate ranging from about 200 sccm to about 1000 sccm. The N$_2$ gas may be flowed into the chamber for a time ranging from 30 seconds to about 600 seconds, at a flowrate ranging from about 200 sccm to about 1000 sccm. Preferably, both the H$_2$ and N$_2$ are flowed into the chamber at a flowrate of about 600 sccm for about 120 seconds. The H$_2$ and N$_2$ gases may be mixed either prior to introduction into the chamber, or upon introduction into the chamber. In addition, sufficient RF power should be applied to generate a plasma of the H$_2$/N$_2$ mixture. Specifically, an RF power ranging from about 1000 watts to about 3600 watts, preferably about 2400 watts, may be applied.

During preconditioning in accordance with the method of the present invention, the direction of cooling water flow may be the same as during cleaning. That is, if during deposition the direction of cooling water flow is from the bottom of the dome to the top of the dome, and during cleaning the direction is reversed such that cooling water flows from top to bottom, then during preconditioning the cooling water may remain flowing from top to bottom.

However, it is preferred that the direction of cooling water flow is again reversed during preconditioning, such that it is opposite the direction during cleaning and the same as the direction during deposition. As discussed previously, if the direction of cooling water flow during deposition is from the bottom of the dome to the top of the dome, then the film coverage will be thinner at the top of the dome. During a subsequent cleaning step, even with the direction of cooling water flow reversed, over-cleaning is more likely to occur at the top of the dome where film coverage is thinner. That is, conversion of Al$_2$O$_3$ to AlF$_3$ will be greater at the top of the dome. During preconditioning to convert AlF$_3$ to Al$_2$O$_3$ and AlN, flowing the cooling water from the bottom of the dome to the top of the dome will result in a slightly greater rate of passivation at the top of the dome where more AlF$_3$ species are located.

Thus, during preconditioning, it is preferred that the direction of cooling water flow is opposite the direction during cleaning and the same as the direction during deposition. If the direction of flow during deposition is from the bottom of the dome to the top of the dome, then the direction during cleaning will be from top to bottom, and the direction during preconditioning is preferably from bottom to top.

While the present invention has been particularly described in conjunction with a preferred embodiment and other alternative embodiments, it is evident that numerous alternatives, modifications and variations will be apparent to those skilled in the art in light of the foregoing description. It is therefore intended that the appended claims embrace all such alternatives, modifications and variations as falling within the true scope and spirit of the present invention.

We claim:

1. A method for preconditioning a dome of a chemical vapor deposition chamber, comprising the steps of:
   introducing hydrogen gas into said chamber;
   generating a reactive plasma of said hydrogen gas in said chamber;
   introducing a mixture of hydrogen gas and nitrogen gas into said chamber; and
   generating a reactive plasma of said mixture of hydrogen gas and nitrogen gas in said chamber.

2. The method of claim 1, wherein said hydrogen gas is introduced at a flowrate of about 200 sccm to about 1000 sccm.

3. The method of claim 1, wherein said hydrogen gas is introduced at a flowrate of about 600 sccm.

4. The method of claim 1, wherein said hydrogen gas is introduced for a time of about 20 seconds to about 240 seconds.

5. The method of claim 1, wherein said hydrogen gas is introduced for a time of about 120 seconds.

6. The method of claim 1, wherein said reactive plasma of said hydrogen gas is generated by applying RF power of about 1000 watts to about 3600 watts.

7. The method of claim 1, wherein said reactive plasma of said hydrogen gas is generated by applying RF power of about 2400 watts.

8. The method of claim 1, wherein said mixture of hydrogen gas and nitrogen gas is formed prior to introduction into said chamber.

9. The method of claim 8, wherein said mixture of hydrogen gas and nitrogen gas is introduced at a flowrate of about 200 sccm to about 1000 sccm.

10. The method of claim 8, wherein said mixture of hydrogen gas and nitrogen gas is introduced at a flowrate of about 600 sccm.

11. The method of claim 1, wherein said mixture of hydrogen gas and nitrogen gas is formed in said chamber by introducing hydrogen gas and nitrogen gas simultaneously into said chamber.

12. The method of claim 11, wherein said hydrogen gas and said nitrogen gas are each introduced at a flowrate about 200 sccm to about 1000 sccm.

13. The method of claim 11, wherein said hydrogen gas and said nitrogen gas are each introduced at a flowrate about 600 sccm.

14. The method of claim 11, wherein said hydrogen gas is introduced for a time of about 20 seconds to about 240 seconds, and said nitrogen gas is introduced for a time of about 30 seconds to about 600 seconds.

15. The method of claim 11, wherein said hydrogen gas and said nitrogen gas are each introduced for a time of about 120 seconds.

16. A method for clearing a dome of a chemical vapor deposition chamber, wherein said dome is cooled during deposition by flowing a cooling fluid in a first direction on through an induction coil having multiple windings provided in an expanding spiral pattern in said dome, comprising the steps of:
   flowing said cooling fluid in a second direction through said induction coil, such that said second direction is opposite said first direction;

introducing at least one cleaning gas into said chamber; and generating a reactive plasma of said cleaning gas.

17. The method of claim 16, wherein said cleaning gas comprises a fluorine-containing gas.

18. The method of claim 16, wherein said cleaning gas is selected from the group consisting of nitrogen trifluoride and hexafluoroethane.

19. The method of claim 16, wherein said reactive plasma is generated by applying RF power to said induction coil.

20. The method of claim 16, wherein said dome has a top and a bottom, said first direction is from the bottom of said dome to the top of said dome, and said second direction is from the top of said dome to the bottom of said dome.

21. The method of claim 16, wherein said dome has a top and a bottom, said first direction is from the top of said dome to the bottom of said dome, and said second direction is from the bottom of said dome to the top of said dome.

22. The method of claim 16, wherein said cooling fluid comprises water.

23. A method for cleaning and preconditioning a dome of a chemical vapor deposition chamber, wherein said dome is cooled during deposition by flowing a cooling fluid in a first direction through an induction coil having multiple windings provided in an expanding spiral pattern in said dome, comprising the steps of:

flowing said cooling fluid in a second direction through said induction coil, such that said second direction is opposite said first direction;

introducing at least one cleaning gas into said chamber;

generating a reactive plasma of said cleaning gas;

evacuating said cleaning gas from said chamber;

flowing said cooling fluid in said first direction through said induction coil;

introducing hydrogen gas into said chamber;

generating a reactive plasma of said hydrogen gas in said chamber;

introducing a mixture of hydrogen gas and nitrogen gas into said chamber; and generating a reactive plasma of said mixture of hydrogen gas and nitrogen gas in said chamber.

24. The method of claim 23, wherein each of said steps of generating a reactive plasma comprises applying RF power to said induction coil.

* * * * *